United States Patent
Gowda (10) Patent No.: US 10,068,879 B2
(45) Date of Patent: Sep. 4, 2018

(54) THREE-DIMENSIONAL STACKED INTEGRATED CIRCUIT DEVICES AND METHODS OF ASSEMBLING THE SAME

(71) Applicant: General Electric Company, Schenectady, NY (US)

(72) Inventor: Arun Virupaksha Gowda, Rexford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/269,576

(22) Filed: Sep. 19, 2016

(65) Prior Publication Data

US 2018/0082981 A1 Mar. 22, 2018

(51) Int. Cl.
*H01L 25/065* (2006.01)
*H01L 23/528* (2006.01)
(Continued)

(52) U.S. Cl.
CPC .......... *H01L 25/0657* (2013.01); *H01L 23/34* (2013.01); *H01L 23/481* (2013.01); *H01L 23/528* (2013.01); *H01L 24/10* (2013.01); *H01L 24/42* (2013.01); *H01L 25/0652* (2013.01); *H01L 25/50* (2013.01);
(Continued)

(58) Field of Classification Search
CPC .......... H01L 25/18; H01L 23/00; H01L 23/34; H01L 25/50; H01L 25/065; H01L 23/367; H01L 23/498; H01L 25/0657; H01L 23/528; H01L 2225/06568; H01L 2225/06541; H01L 2225/0651; H01L 23/481; H01L 24/10; H01L 24/42;
(Continued)

(56) References Cited

U.S. PATENT DOCUMENTS 6,239,484 B1 * 5/2001 Dore ...................... H01L 21/563
257/687
6,678,167 B1 * 1/2004 Degani ................... H01L 23/36
257/E23.101

(Continued)

FOREIGN PATENT DOCUMENTS

WO 2013004836 A1 1/2013

OTHER PUBLICATIONS

Mark Osborne, "Future DRAM on logic 3D IC revealed by IMEC", Fabtech, http://www.fabtech.org/news/_a/future_dram_on_logic_3d_ic_revealed_by_imec/, Oct. 1, 2009.

(Continued)

*Primary Examiner* — Alexander Oscar Williams
(74) *Attorney, Agent, or Firm* — GE Global Patent Operation; John Darling (57) ABSTRACT

An integrated circuit (IC) device is described. The IC device includes a substrate. A connection component including a cavity therethrough is attached to the substrate. A memory die is positioned in the cavity of the connection component and is electrically coupled to the substrate. A logic die extends over the memory die and at least a portion of the connection component, and is electrically coupled to the connection component and the memory die. The connection component is formed free of through silicon vias and is electrically coupled to the substrate through wire bonding.

20 Claims, 7 Drawing Sheets

(51) Int. Cl.
    *H01L 23/34*     (2006.01)
    *H01L 23/48*     (2006.01)
    *H01L 23/00*     (2006.01)
    *H01L 25/00*     (2006.01)
    *H01L 23/31*     (2006.01)

(52) U.S. Cl.
    CPC ............... *H01L 23/3128* (2013.01); *H01L 2224/16225* (2013.01); *H01L 2225/0651* (2013.01); *H01L 2225/06541* (2013.01); *H01L 2225/06568* (2013.01); *H01L 2924/15192* (2013.01); *H01L 2924/181* (2013.01)

(58) Field of Classification Search
    CPC ....... H01L 25/0652; H01L 2924/15192; H01L 2924/181; H01L 2924/00012
    USPC ....... 257/773, 774, 777, 686, 685, 723, 728, 257/737, 738, 778, 734
    See application file for complete search history.

(56) References Cited

U.S. PATENT DOCUMENTS

| | | | |
|---|---|---|---|
| 8,865,521 | B2 | 10/2014 | Jeng et al. |
| 9,466,561 | B2 * | 10/2016 | Li ........................ H01L 23/13 |
| 9,780,079 | B2 * | 10/2017 | Li ........................ H01L 25/18 |
| 2008/0230913 | A1 | 9/2008 | Huang et al. |
| 2008/0283992 | A1 * | 11/2008 | Palaniappan ......... H01L 25/105 257/686 |
| 2009/0001543 | A1 | 1/2009 | Chung |
| 2011/0024899 | A1 * | 2/2011 | Masumoto ........ H01L 23/49816 257/737 |
| 2011/0210444 | A1 * | 9/2011 | Jeng ........................ H01L 23/13 257/738 |
| 2012/0187578 | A1 * | 7/2012 | Li ........................... H01L 23/13 257/778 |
| 2013/0119527 | A1 | 5/2013 | Luo et al. |
| 2013/0241052 | A1 * | 9/2013 | Chang ............... H01L 23/49816 257/737 |
| 2014/0013132 | A1 | 1/2014 | De et al. |
| 2014/0177626 | A1 | 6/2014 | Thottethodi et al. |
| 2014/0191419 | A1 | 7/2014 | Mallik et al. |
| 2014/0217610 | A1 * | 8/2014 | Jeng .................... H01L 23/3128 257/774 |
| 2015/0091179 | A1 | 4/2015 | Shenoy et al. |
| 2015/0199126 | A1 | 7/2015 | Jayasena et al. |
| 2015/0235990 | A1 * | 8/2015 | Cheng .................... H01L 25/50 257/712 |
| 2015/0243630 | A1 | 8/2015 | Jann et al. |
| 2015/0255441 | A1 * | 9/2015 | Lamorey ................ H01L 25/18 257/704 |
| 2015/0279828 | A1 * | 10/2015 | Koopmans .............. H01L 25/18 257/713 |
| 2016/0043068 | A1 | 2/2016 | Ramachandran et al. |
| 2016/0322337 | A1 * | 11/2016 | Liang .................... H01L 25/105 |
| 2016/0322340 | A1 * | 11/2016 | Li ........................... H01L 25/18 |
| 2017/0062383 | A1 * | 3/2017 | Yee .................... H01L 25/0652 |

OTHER PUBLICATIONS

Extended European Search Report and Opinion issued in connection with corresponding EP Application No. 17189912.3 dated Feb. 20, 2018.

* cited by examiner

PRIOR ART

THREE-DIMENSIONAL STACKED INTEGRATED CIRCUIT DEVICES AND METHODS OF ASSEMBLING THE SAME

BACKGROUND

The subject matter disclosed herein relates generally to integrated circuit devices, and more particularly, to three-dimensional stacked integrated circuit devices including an interposer.

In conventional three-dimensional (3D) stacked integrated circuit (IC) packaging, semiconductor devices are stacked and interconnected to each other vertically, enabling a smaller IC package size and facilitating increased electrical performance (e.g., increased bandwidth, reduced power consumption, etc.). At least some known 3D stacked IC devices include a memory device—or a memory stack—that is placed on top of a logic device due to the increased number of interconnects of the logic device that need to connect to external circuitry. Typically, logic devices, however, have increased power dissipation, and therefore, increased operating temperatures, in comparison to the memory devices. Thus, with at least some 3D stacked IC devices it is not a thermally advantageous arrangement to position the logic device between the memory device and a substrate of the 3D stacked IC devices.

In addition, at least some known 3D stacked IC devices include through silicon vias (TSVs) formed in the logic device to facilitate electrically connecting the memory device to the external circuitry, which adds complexity and cost to the manufacturing of the logic device. In at least some known 3D stacked IC devices, the number of interconnects between the logic device and the memory and external circuitry would require an increase in the number of TSVs in the memory device, thereby reducing the efficient use and cost effectiveness of the memory device real estate.

BRIEF DESCRIPTION

In one aspect, an integrated circuit (IC) device is provided. The IC device includes a substrate. The IC device also includes a connection component including a cavity defined therethrough. The connection component is coupled to the substrate. In addition, the IC device includes at least one memory die positioned in the cavity. The at least one memory die is electrically coupled to the substrate. Moreover, the IC device includes a logic die extending over the at least one memory die and at least a portion of the connection component. The at least one logic die is electrically coupled to the connection component and the at least one memory die. The connection component is free of through silicon vias, and is electrically coupled to the substrate through at least one wire bond.

In another aspect, another integrated circuit (IC) device is provided. The IC device includes a substrate having a first active surface. The first active surface includes a plurality of substrate bonding pads. The IC device also includes a plurality of connection components coupled to the first active surface of the substrate. The plurality of connection components is arranged to define a cavity between the plurality of connection components. Each connection component of the plurality of connection components includes a second active surface opposite from the first active surface of the substrate. Each second active surface includes at least one connection component bonding pad. Moreover, the IC device includes at least one memory die positioned within the cavity and electrically coupled to the first active surface of the substrate. In addition, the IC device includes a logic die coupled to each second active surface and the at least one memory die. The plurality of connection components are free of through silicon vias. Furthermore, each of the at least one connection component bonding pads is electrically coupled to a substrate bonding pad of the plurality of substrate bonding pads.

In yet another aspect, a method of forming an IC device having a 3D package structure is provided. The method includes forming a connection component free of through silicon vias. The connection component includes a cavity defined therethrough and a redistribution wiring layer including a connection component bonding pad. The method also includes coupling the connection component to a substrate. The substrate includes a substrate bonding pad. Moreover, the method includes coupling at least one memory die to the substrate such that memory die is positioned within the cavity. Furthermore, the method includes extending a logic die over the memory die and at least a portion of the connection component, and electrically coupling the logic die to the memory die and the at least a portion of the connection component. In addition, the method includes electrically coupling the connection component bonding pad to the substrate bonding pad.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The devices and methods described herein facilitate increasing the efficiency of an integrated circuit device by configuring a passive connection component to surround a memory die connected to and positioned between a logic die and a package substrate. The logic die and the memory die are coupled to each other and communicate directly via solder micro-bumps. The logic die is electrically coupled to the package substrate via the passive connection component positioned about the memory die via solder micro-bumps. The memory die is provided with through silicon vias (TSVs) to enable communication between the logic die and the package substrate. In addition, the memory die is coupled directly to the substrate package via solder micro-bumps. As such, the embodiments described herein provide for increasing the thermal dissipation, or efficiency, of the logic die by positioning the logic die (the higher power dissipation component) above the memory die (the lower power dissipation component) away from the package substrate. This facilitates increased thermal management and increased performance of the logic die. In addition, the embodiments described reduce the need for providing TSVs in the logic die to enable connections of the memory die directly to the package substrate. This facilitates decreasing the manufacturing cost of the logic die by reducing the size and complexity of the logic die.

Figure 1:
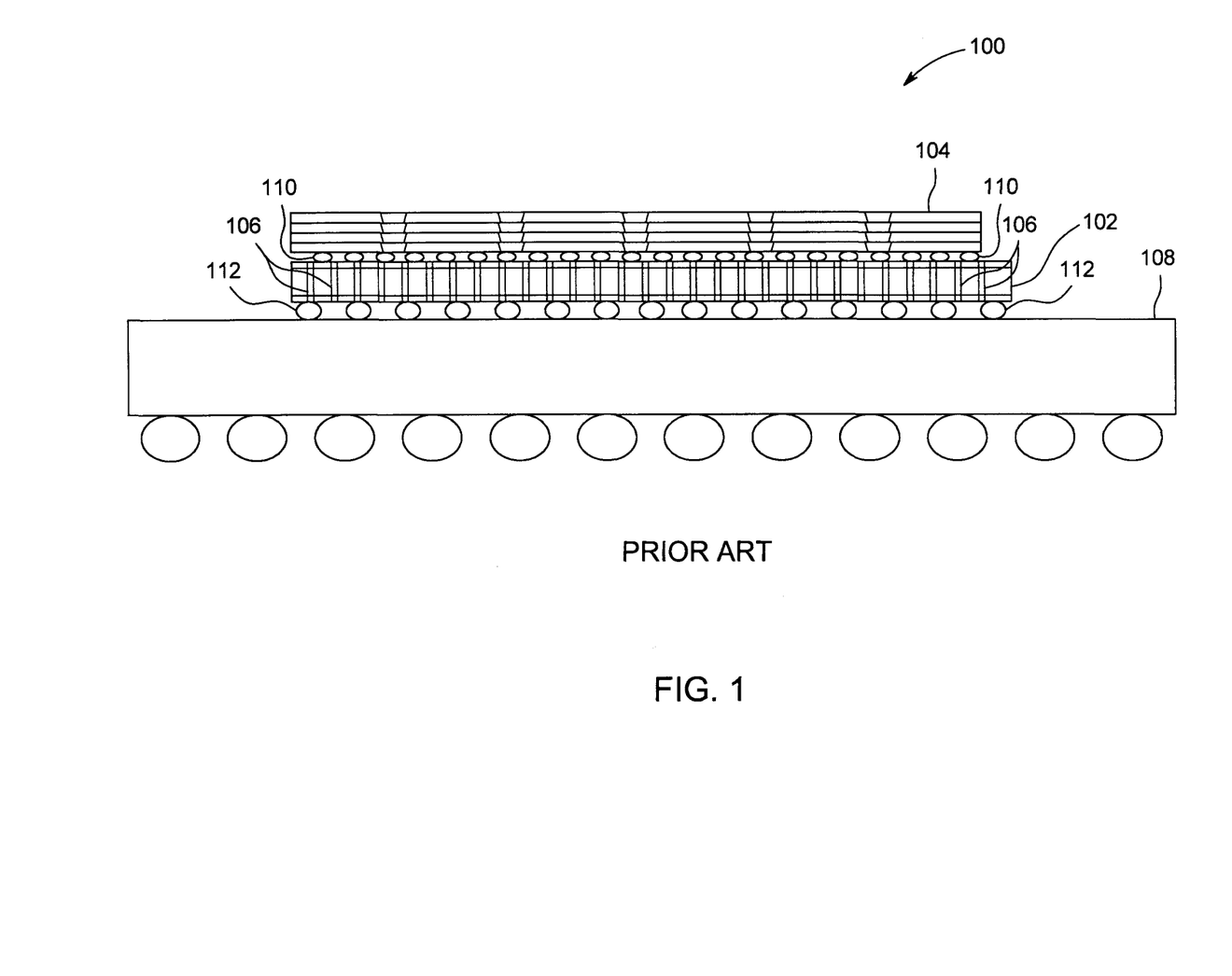
FIG. 1 is a schematic front view of a prior art integrated circuit (IC) device formed in a single three-dimensional (3D) package structure.

FIG. 1 is a schematic front view of a prior art integrated circuit (IC) device 100 formed in a single three-dimensional (3D) package structure. A typical 3D package structure includes at least one die being mounted on the top of another die, with the lower die having TSVs to allow the upper die to communicate with the lower die and the package substrate. For example, as shown in FIG. 1, IC device 100 is fabricated as a single 3D package including a logic die 102 and at least one memory die 104. Logic die 102 and memory die 104 are coupled directly to each other via solder micro-bumps 110 and are vertically integrated, i.e., memory die 104 is positioned on top of logic die 102 substantially covering logic die 102. Logic die 102 is coupled to a package substrate 108 via a plurality of solder micro-bumps 112. Logic die 102 includes a plurality of TSVs 106 that enable at least some connections of memory die 104 to couple to package substrate 108 via solder micro-bumps 112. While the lengths of TSVs 106 are reduced compared to wire bonds typically found in package-on-package structures, as described herein, the TSVs 106 add size and complexity to the logic die 102. This results in an increased manufacturing cost associated with logic die 102. In addition, the thermal efficiency of IC device 100 is reduced because heat generated by logic die 102 is transferred to memory die 104. Moreover, heat cannot be readily removed directly from logic die 102.

Figure 2:
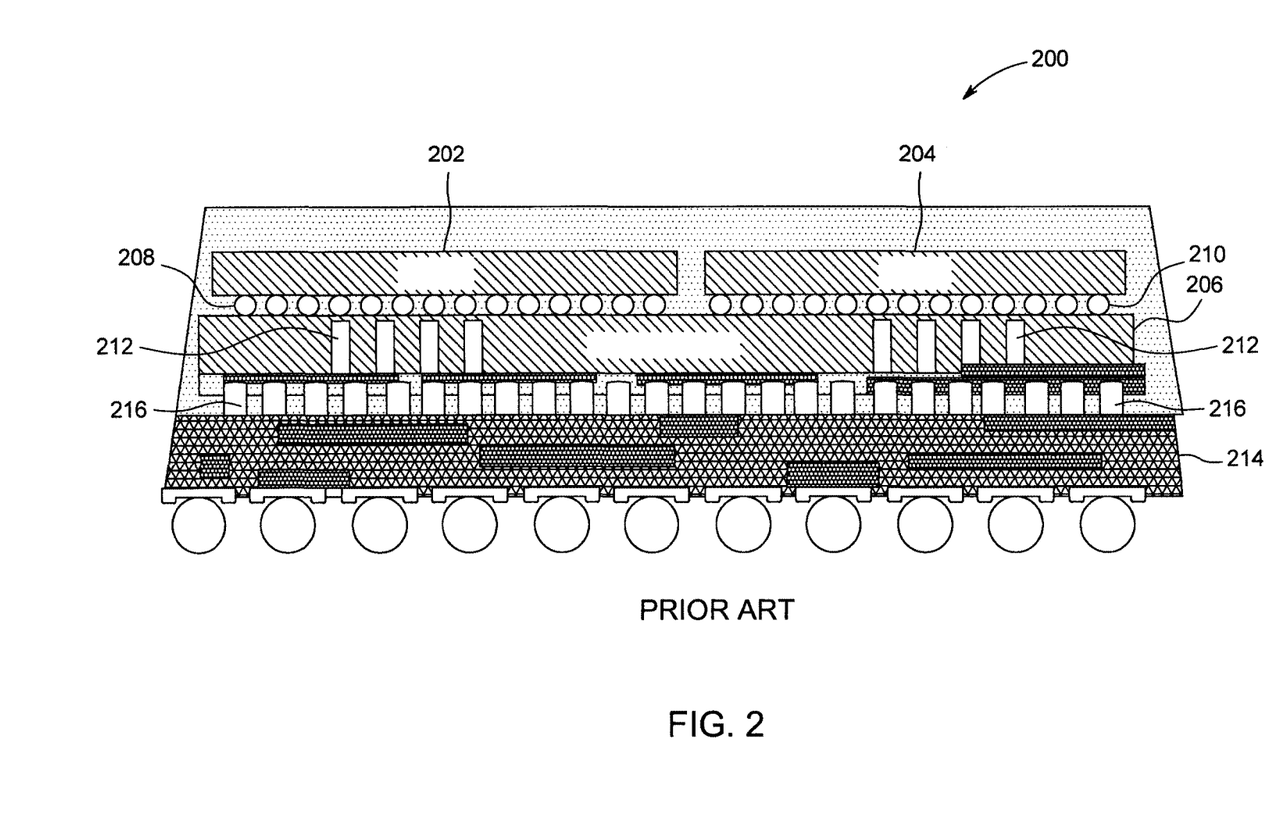
FIG. 2 is a schematic front view of a prior art IC device formed in a single 2.5-dimensional (2.5D) package structure.

FIG. 2 is a schematic front view of a prior art IC device 200 formed in a single 2.5-dimensional (2.5D) package structure. A typical 2.5D package structure includes at least one die being mounted next to another die in a single plane, with an interposer placed between the package substrate and the two dies, where the interposer has TSVs connecting metallization layers on its upper and lower surfaces. For example, as shown in FIG. 2, IC device 200 is fabricated as a single 2.5D package including a logic die 202, at least one memory die 204, and an interposer 206. Logic die 202 and memory die 204 are coupled directly to interposer 206 via solder micro-bumps 208 and 210, respectively, in a side-by-side arrangement. Interposer 206 includes electrical circuitry (not shown) that enables direct communication between logic die 202 and memory die 204. Interposer 206 is typically fabricated from silicon, although other materials such as glass, ceramic, and/or organic materials are also used. Interposer 206 includes a plurality of TSVs 212 that enable at least some connections of logic die 202 and memory die 204 to couple to a package substrate 214 via solder micro-bumps 216. The side-by-side 2.5D package structure, however, results in an increased size of IC device 200. In addition, the length of the connection paths between logic die 202 and memory die 204 are increased compared to the 3D package structure shown in FIG. 1, which results in additional inefficiencies of IC device 200. In addition, interposer 206 includes TSVs 212 and connection circuitry for logic die 202 and memory die 204, which results in an increased manufacturing cost associated with IC device 200.

Figure 3:
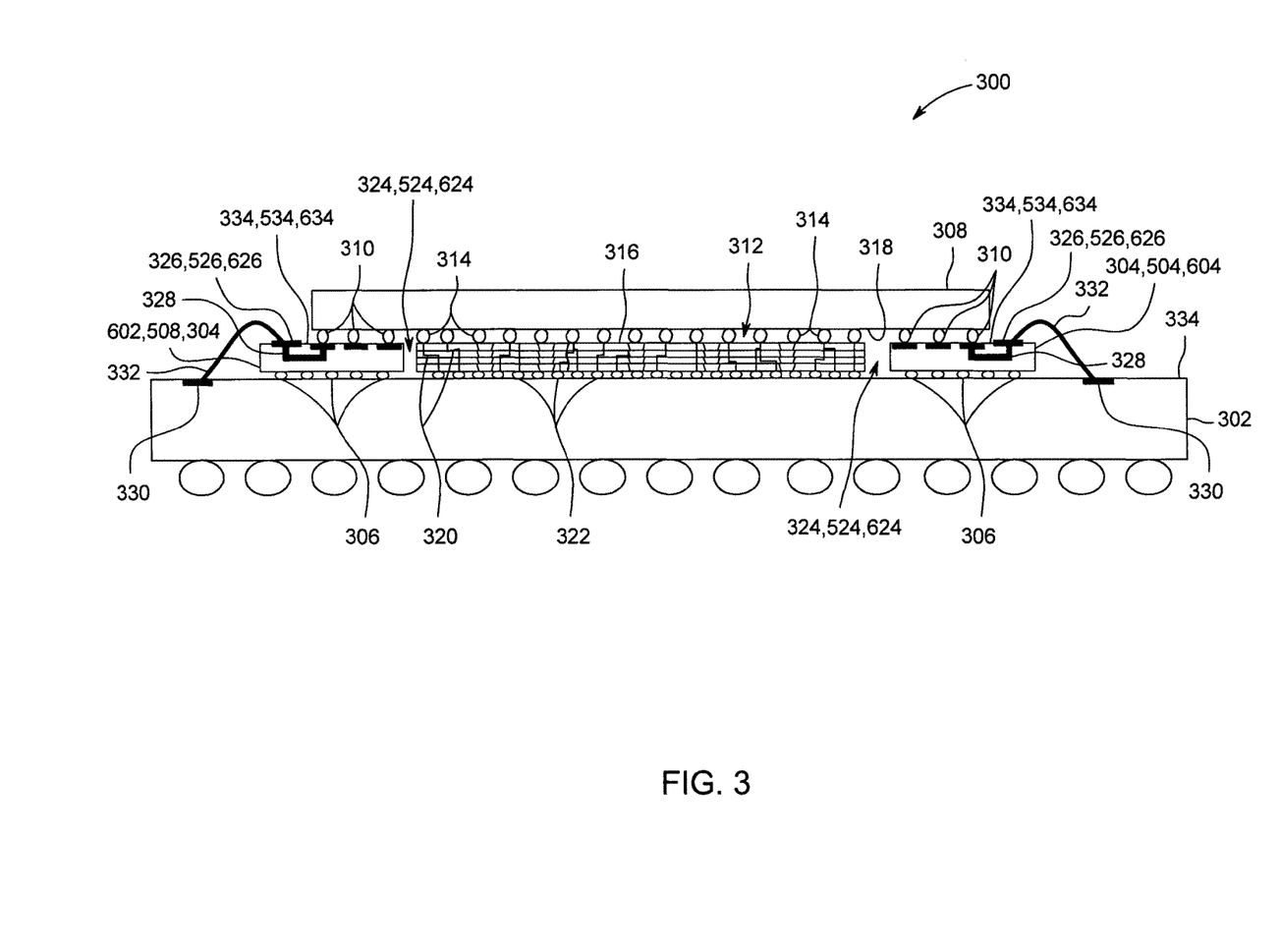
FIG. 3 is a sectional view of an exemplary IC device formed in a single 3D package structure.
Figure 4:
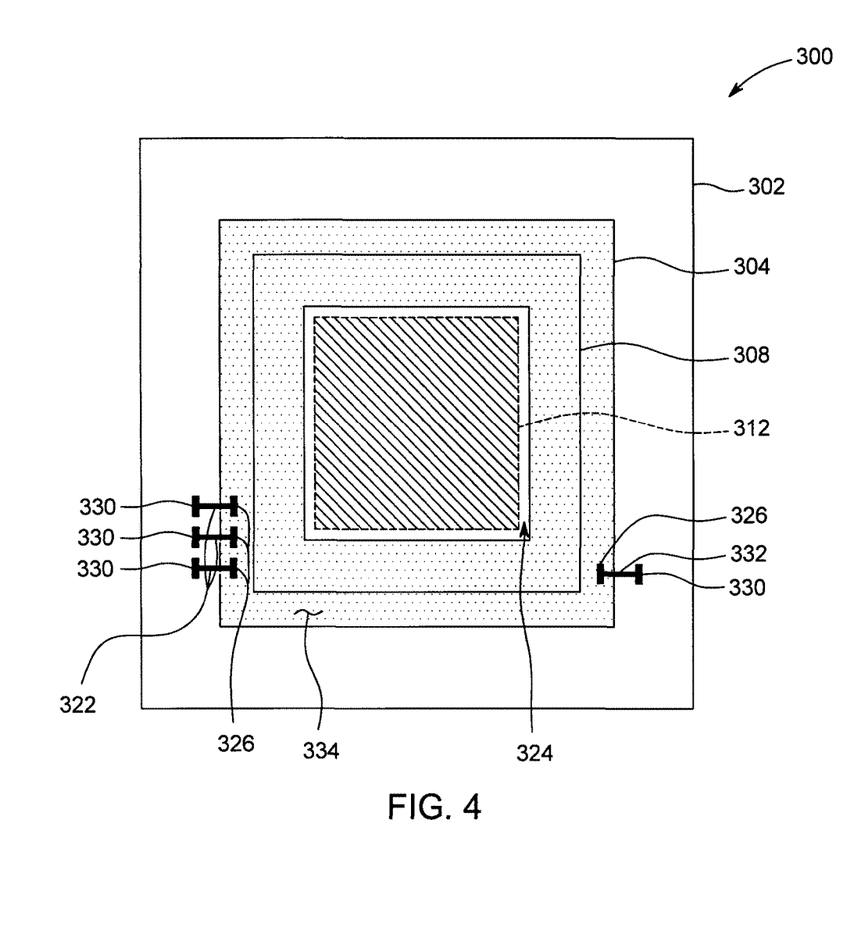
FIG. 4 is a schematic plan view of the IC device shown in FIG. 3.

FIG. 3 is a sectional view of an exemplary IC device 300 formed in a single 3D package structure. FIG. 4 is a schematic plan view of IC device 300 shown in FIG. 3. With reference to FIGS. 3 and 4, IC device 300 is fabricated as a single 3D package and includes a package substrate 302, an interposer component or connection component 304, at least one logic die 308, and at least one memory die 312. Connection component 304 is coupled to package substrate 302 via a plurality of solder micro-bumps 306. The at least one logic die 308 is positioned on connection component 304, opposite package substrate 302. Logic die 308 is coupled directly to connection component 304 via a plurality of solder micro-bumps 310. In some embodiments, logic die 308 is a single chip, and in other embodiments, logic die 308 is a multi-chip (e.g., a side-by-side chip arrangement) package. Logic die 308 includes, for example, and without limitation, a processor, processing device, or controller, such as a general purpose central processing unit (CPU), a graphics processing unit (GPU), an accelerated processing unit (APU), a microcontroller, a reduced instruction set computer (RISC) processor, an application specific integrated circuit (ASIC), a programmable logic circuit (PLC), a programmable logic unit (PLU), a field programmable gate array (FPGA), gate arrays, a digital signal processing (DSP) device, and/or any other logic circuit or processing device that enables IC device 300 to function as described herein.

In the exemplary embodiment, connection component 304 is formed as a single component extending about a perimeter of logic die 308 and having a cavity 324 defined. Cavity 324 is formed therein via the removal of material from a generally central portion of connection component 304. As shown in FIG. 4, connection component 304 is generally rectangular-shaped and defines a generally rectangular-shaped cavity 324. While connection component 304 is shown having a generally rectangular-shape, alternatively, connection component 304 has any shape that enables connection component 304 to function as described herein.

In addition, cavity 324 may be formed in any location in connection component 304 and need not be generally centrally located.

Moreover, in the exemplary embodiment, connection component 304 is fabricated from silicon and includes one or more redistribution wiring layers 334. Alternatively, connection component 304 is fabricated from any material that enables connection component 304 to function as described herein, for example, and without limitation, glass, ceramic, organic materials, germanium, gallium arsenide, indium phosphide, and silicon carbide. Redistribution wiring layer 334 facilitates electrical connection points or pins (not shown) of logic die 308, for example locations corresponding to solder micro-bumps 310, to be available to other locations on connection component 304. Thus, redistribution wiring layer 334 facilitates routing the electrical connection points or pins of logic die 308 to favorable locations on connection component 304 to facilitate enabling bonding from different locations on logic die 308 to similar and/or adjacent locations on connection component 304, thereby simplifying assembly of IC device 300.

Furthermore, in the exemplary embodiment, connection component 304 is a passive interposer. For example, and without limitation, in some embodiments, connection component 304 does not include additional electrical components, including only the one or more redistribution wiring layers 334. In other embodiments, connection component 304 includes one or more integrated passive devices (IPDs) embedded and/or formed thereon, for example, and without limitation, resistors, capacitors, inductors, or any other passive electrical devices that enable connection component 304 to function as described herein. Thus, in the exemplary embodiment, connection component 304 does not include active electrical components, for example, and without limitation, transistors, signal amplifiers, signal filters, or any other active electrical components. Alternatively, in some embodiments, connection component 304 is an active interposer and includes one or more active electrical components embedded and/or formed thereon.

With reference to FIGS. 3 and 4, in the exemplary embodiment, memory die 312 represents a stacked or multiple chip arrangement. Alternatively, memory die 312 may be a single chip and/or an unstacked chip arrangement. In the exemplary embodiment, logic die 308 and memory die 312 are coupled directly to each other via solder micro-bumps 314 and are vertically integrated, i.e., memory die 312 is positioned vertically with respect to logic die 308. In alternative embodiments, logic die 308 and memory die 312 are coupled directly to each other using any connection method that enables IC device 300 to function as described herein, for example, and without limitation, via diffusion bonding, eutectic bonding, thermal compression bonding, and the use of conductive polymers. In the exemplary embodiment, memory die 312 is positioned below logic die 308. More specifically, memory die 312 is positioned vertically between logic die 308 and package substrate 302 such that logic die 308 overlies memory die 312. Memory die 312 is positioned in cavity 324 of connection component 304, and logic die 308 entirely overlaps memory die 312. In alternative embodiments, logic die 308 only partially overlaps memory die 312.

In the exemplary embodiment, as shown in FIG. 3, an active surface 316 of memory die 312 is oriented toward an active surface 318 of logic die 308 and away from substrate 302, i.e., logic die 308 and memory die 312 are oriented in a face-to-face arrangement. Memory die 312 includes a plurality of through silicon vias (TSVs) 320 formed therein to enable electrical connection directly to package substrate 302. TSVs 320 are coupled directly to substrate 302 via a plurality of solder micro-bumps 322. In alternative embodiments, TSVs 320 are coupled directly to substrate 302 using any connection method that enables IC device 300 to function as described herein, for example, and without limitation, via diffusion bonding, eutectic bonding, thermal compression bonding, and the use of conductive polymers. In some embodiments, TSVs 320 are formed in memory die 312 using any known manufacturing technique such as laser drilling, mechanical drilling, and/or etching processes. TSVs 320 and solder micro-bumps 322 enable at least one electrical connection of memory die 312 to connect to other circuitry (not shown) on substrate 302 without passing through logic die 308. This facilitates increasing the efficiency of IC device 300 as well as reducing manufacturing costs associated with the fabrication of IC device 300.

In alternative embodiments, memory die 312 can be oriented such that active surface 316 of memory die 312 is oriented away from active surface 318 of logic die 308 and toward substrate 302. In such embodiments, TSVs 320 of memory die 312 facilitate electrical connection directly to logic die 308. Also, in such embodiments, TSVs 320 are coupled directly to logic die 308 via solder micro-bumps, such as solder micro-bumps 314. As such, TSVs 320 and solder micro-bumps 314 enable at least one electrical connection of memory die 312 to connect directly to logic die 308 without passing through substrate 302. In alternative embodiments, logic die 308 and TSVs 320 are coupled directly to each other using any connection method that enables IC device 300 to function as described herein, for example, and without limitation, via diffusion bonding, eutectic bonding, thermal compression bonding, and the use of conductive polymers.

In the exemplary embodiment, as shown in FIGS. 3 and 4 and described herein, logic die 308 is coupled directly to connection component 304 via a plurality of solder micro-bumps 310. Connection component 304 includes one or more wire bonding pads 326 formed on redistribution wiring layer 334. Bonding pads 326 are electrically connected to at least one solder micro-bump 310 via an electrical circuit (not shown) formed on redistribution wiring layer 334 and/or internal circuitry 328 formed within one or more build-up layers (not shown) of connection component 304. Thus an electrical signal (not shown) is transmitted from logic die 308 to one or more wire bonding pads 326. Moreover, substrate 302 includes one or more wire bonding pads 330, which connect to other circuitry (not shown) via an electrical circuit and/or internal circuitry (not shown) formed on/in an active surface 331 of substrate 302. It is noted that, as opposed to at least some known interposers, connection component 304 is free of through silicon vias, thereby facilitating decreasing a complexity and manufacturing cost of fabricating connection component 304.

In the exemplary embodiment, connection component bonding pads 326 and substrate bonding pads 330 are electrically coupled together through wires 332. This facilitates connecting logic die 308 directly to substrate 302. Wires 332 are fabricated from, for example, and without limitation, gold, aluminum, copper, and alloys thereof. Coupling logic die 308 to substrate 302 via wires 332 facilitates a cost effective and flexible technique for coupling IC device 300 to other electrical devices and/or circuits (not shown).

Figure 5:
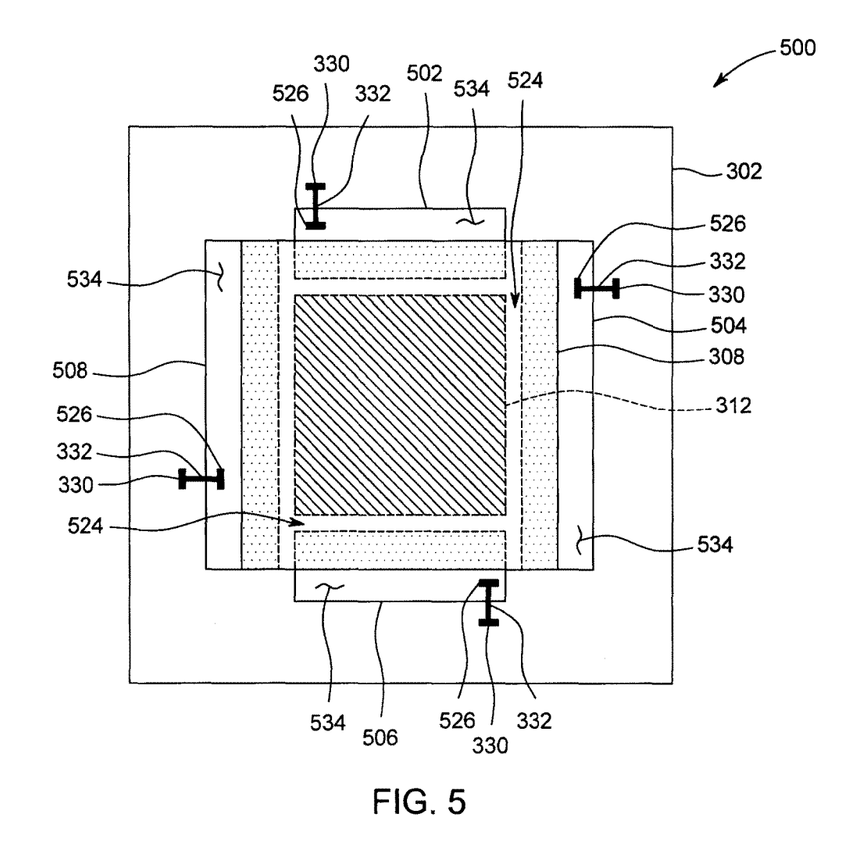
FIG. 5 is a schematic plan view of an alternative IC device formed in a single 3D package structure.

FIG. 5 is a schematic plan view of an IC device 500 formed in a single 3D package structure. With reference to FIGS. 3 and 5, in the exemplary embodiment, IC device 500 is fabricated substantially similar to IC device 300, as described herein. IC device 500 includes package substrate 302, at least one logic die 308, and at least one memory die 312. However, as opposed to the unitary connection component 304 described herein with respect to IC device 300, IC device 500 includes one or more connection components, for example connection components 502, 504, 506, and 508, as shown in FIG. 5. Connection components 502, 504, 506, and 508 are coupled to package substrate 302 via a plurality of solder micro-bumps 306. Logic die 308 is positioned on and coupled to connection components 502, 504, 506, and 508 opposite package substrate 302. Logic die 308 is coupled directly to connection components 502, 504, 506, and 508 via a plurality of solder micro-bumps 310. In some embodiments, logic die 308 is a single chip, and in other embodiments, logic die 308 is a multi-chip (e.g., a side-by-side chip arrangement) package. As described herein, logic die 308 includes, for example, and without limitation, a processor, processing device, or controller, such as a general purpose central processing unit (CPU), a graphics processing unit (GPU), an accelerated processing unit (APU), a microcontroller, a reduced instruction set computer (RISC) processor, an application specific integrated circuit (ASIC), a programmable logic circuit (PLC), a programmable logic unit (PLU), a field programmable gate array (FPGA), gate arrays, a digital signal processing (DSP) device, and/or any other logic circuit or processing device that enables IC device 500 to function as described herein.

In the exemplary embodiment, connection components 502, 504, 506, and 508 are discrete components positioned proximate a perimeter of logic die 308, defining a cavity 524 therebetween for receiving memory die 312. As shown in FIG. 5, connection components 502, 504, 506, and 508 are generally rectangular-shaped components positioned to define a generally rectangular-shaped cavity 524. It is noted, however, that while connection components 502, 504, 506, and 508 are shown having generally rectangular shapes, it is contemplated that connection components 502, 504, 506, and 508 can have any shape that enables connection components 502, 504, 506, and 508 to function as described herein.

In the exemplary embodiment, each of connection components 502, 504, 506, and 508 are only partially overlain by logic device 308. In such an embodiment, one or more of connection components 502, 504, 506, and 508 may be an active connection component. For example, in one embodiment, one or more of connection components 502, 504, 506, and 508 include active electrical components embedded and/or formed thereon, for example, and without limitation, transistors, signal amplifiers, signal filters, and any other active electrical component that enables the one or more connection components 502, 504, 506, and 508 to function as described herein. Such active electrical components are placed on portions of connection components 502, 504, 506, and 508 that are not overlain by logic device 308.

In alternative embodiments, one or more of connection components 502, 504, 506, and 508 is a passive interposer. For example, and without limitation, in some such alternative embodiments, one or more of connection components 502, 504, 506, and 508 do not include additional electrical components. In other such embodiments, one or more of connection components 502, 504, 506, and 508 include one or more integrated passive devices (IPDs) embedded and/or formed thereon, for example, and without limitation, resistors, capacitors, inductors, and any other passive electrical components that enable connection components 502, 504, 506, and 508 to function as described herein.

Furthermore, in the exemplary embodiment, connection components 502, 504, 506, and 508 are fabricated from silicon and include one or more redistribution wiring layers 334 (i.e., and active surface). Alternatively, connection components 502, 504, 506, and 508 are fabricated from any material that enables connection components 502, 504, 506, and 508 to function as described herein, for example, and without limitation, glass, ceramic, organic materials, germanium, gallium arsenide, indium phosphide, and silicon carbide. Redistribution wiring layer 334 facilitates electrical connection points or pins (not shown) of logic die 308, for example locations corresponding to solder micro-bumps 310, to be available to other locations on connection components 502, 504, 506, and 508. Thus, redistribution wiring layer 334 facilitates routing the electrical connection points or pins of logic die 308 to favorable locations on connection components 502, 504, 506, and 508 to facilitate enabling bonding from different locations on logic die 308 to similar and/or adjacent locations on connection components 502, 504, 506, and 508, thereby simplifying assembly of IC device 500.

With reference to FIGS. 3 and 5, logic die 308 and memory die 312 are coupled directly to each other via solder micro-bumps 314 and are vertically integrated, i.e., memory die 312 is positioned vertically below logic die 308. More specifically, memory die 312 is positioned vertically between logic die 308 and package substrate 302 such that logic die 308 overlies memory die 312. In such an embodiment, memory die 312 is positioned in cavity 524 defined by connection components 502, 504, 506, and 508, and logic die 308 overlaps memory die 312 entirely. Alternatively, logic die 308 only partially overlaps memory die 312.

In the exemplary embodiment, logic die 308 is coupled directly to connection components 502, 504, 506, and 508 via a plurality of solder micro-bumps 310. Connection components 502, 504, 506, and 508 include one or more wire bonding pads 526 formed on a redistribution wiring layer 534. Bonding pads 526 are electrically connected to at least one solder micro-bump 310 via an electrical circuit (not shown) formed on redistribution wiring layer 534 and/or internal circuitry 328 formed within one or more build-up layers (not shown) of connection components 502, 504, 506, and 508. Thus an electrical signal (not shown) is transmitted from logic die 308 to one or more wire bonding pads 526. It is noted that, as opposed to at least some known interposers, connection components 502, 504, 506, and 508 are free of through silicon vias, thereby facilitating decreasing a complexity and manufacturing cost of fabricating connection components 502, 504, 506, and 508.

In the exemplary embodiment, connection component bonding pads 526 and substrate bonding pads 330 are electrically coupled together through wires 332. This facilitates connecting logic die 308 directly to substrate 302. As described herein, wires 332 are fabricated from, for example, and without limitation, gold, aluminum, copper, and alloys thereof. Coupling logic die 308 to substrate 302 via wires 332 facilitates a cost effective and flexible technique for coupling IC device 500 to other electrical devices and/or circuits (not shown).

Figure 6:
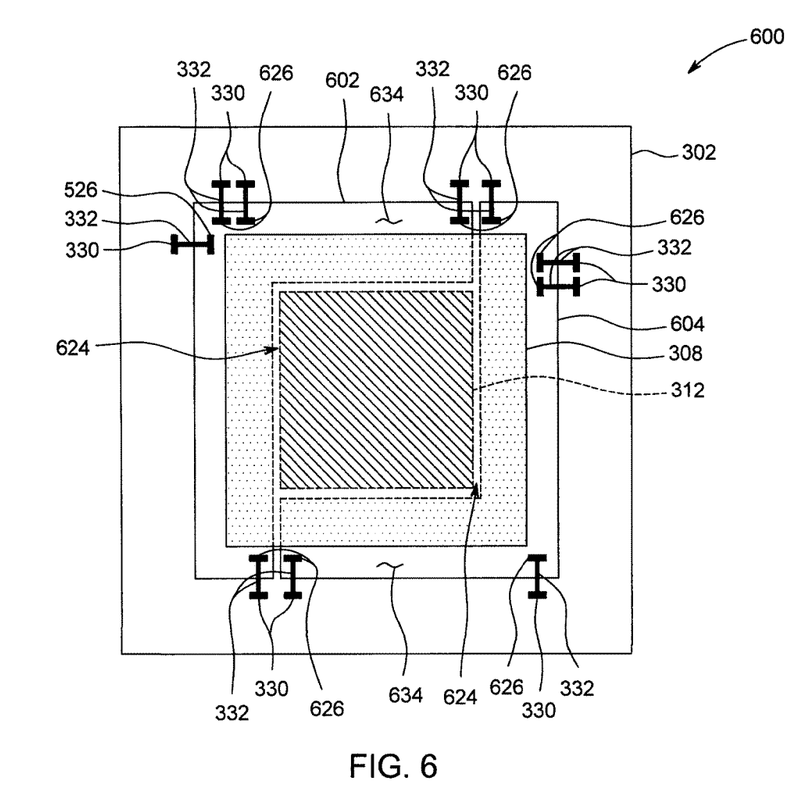
FIG. 6 is a schematic plan view of another alternative IC device formed in a single 3D package structure.

FIG. 6 is a schematic plan view of an IC device 600 formed in a single 3D package structure. With reference to FIGS. 3 and 6, in the exemplary embodiment, IC device 600 is fabricated substantially similar to IC devices 300 and 500, as are described herein. For example, IC device 600 includes package substrate 302, at least one logic die 308, and at least one memory die 312. However, as opposed to the unitary connection component 304 or generally rectangular-shaped connection components 502, 504, 506, and 508 described herein with respect to IC devices 300 and 500, respectively, IC device 600 includes one or more "L-shaped" connection components, for example connection components 602 and 604, as shown in FIG. 6. Connection components 602 and 604 are coupled to package substrate 302 via a plurality of solder micro-bumps 306. Logic die 308 is positioned on and coupled to connection components 602 and 604 opposite package substrate 302. Logic die 308 is coupled directly to connection components 602 and 604 via a plurality of solder micro-bumps 310.

In the exemplary embodiment, connection components 602 and 604 are discrete components positioned about a perimeter of logic die 308, defining a cavity 624 therebetween for receiving memory die 312. As shown in FIG. 6, connection components 602 and 604 are positioned to define a generally rectangular-shaped cavity 624. Logic die 308 and memory die 312 are coupled directly to each such that memory die 312 is positioned vertically between logic die 308 and package substrate 302. In such an embodiment, memory die 312 is positioned in cavity 624 defined by connection components 602 and 604, and logic die 308 overlaps memory die 312 entirely. Alternatively, logic die 308 only partially overlaps memory die 312.

In the exemplary embodiment, as shown in FIGS. 3 and 6, logic die 308 is coupled directly to connection components 602 and 604 via a plurality of solder micro-bumps 310. Connection components 602 and 604 include one or more wire bonding pads 626 formed on a redistribution wiring layer 634. Bonding pads 626 are electrically connected to at least one solder micro-bump 310 via an electrical circuit (not shown) formed on redistribution wiring layer 634 and/or internal circuitry 328 formed within one or more build-up layers (not shown) of connection components 602 and 604. Thus an electrical signal (not shown) is transmitted from logic die 308 to one or more wire bonding pads 626. It is noted that, as opposed to at least some known interposers, connection components 602 and 604 are free of through silicon vias, thereby facilitating decreasing a complexity and manufacturing cost of fabricating connection components 602 and 604.

Moreover, in the exemplary embodiment, connection component bonding pads 626 and substrate bonding pads 330 are electrically coupled together through wires 332. This facilitates connecting logic die 308 directly to substrate 302. As described herein, wires 332 are fabricated from, for example, and without limitation, gold, aluminum, copper, and alloys thereof. Coupling logic die 308 to substrate 302 via wires 332 facilitates a cost effective and flexible technique for coupling IC device 600 to other electrical devices and/or circuits (not shown).

Furthermore, in the exemplary embodiment, connection components 602 and 604 are formed in substantially the same manner as connection component 304 and/or connection components 502, 504, 506, and 508. For example, connection components 602 and 604 are fabricated from silicon and include one or more redistribution wiring layers 634. Alternatively, connection components 602 and 604 are fabricated from any material that enables connection components 602 and 604 to function as described herein, for example, and without limitation, glass, ceramic, organic materials, germanium, gallium arsenide, indium phosphide, and silicon carbide. In addition, in some embodiments, one or more of connection components 602 and 604 is an active connection component, including one or more active electrical components embedded and/or formed thereon, for example, and without limitation, transistors, signal amplifiers, signal filters, and any other active electrical component that enables the one or more inter connection components 602 and 604 to function as described herein. In other embodiments, one or more of connection components 602 and 604 is a passive interposer, i.e., connection components 602 and 604 do not include additional electrical components. In some such embodiments, one or more of connection components 602 and 604 include one or more integrated passive devices (IPDs) embedded and/or formed thereon, for example, and without limitation, resistors, capacitors, inductors, and any other passive electrical components that enable connection components 602 and 604 to function as described herein.

Figure 7:
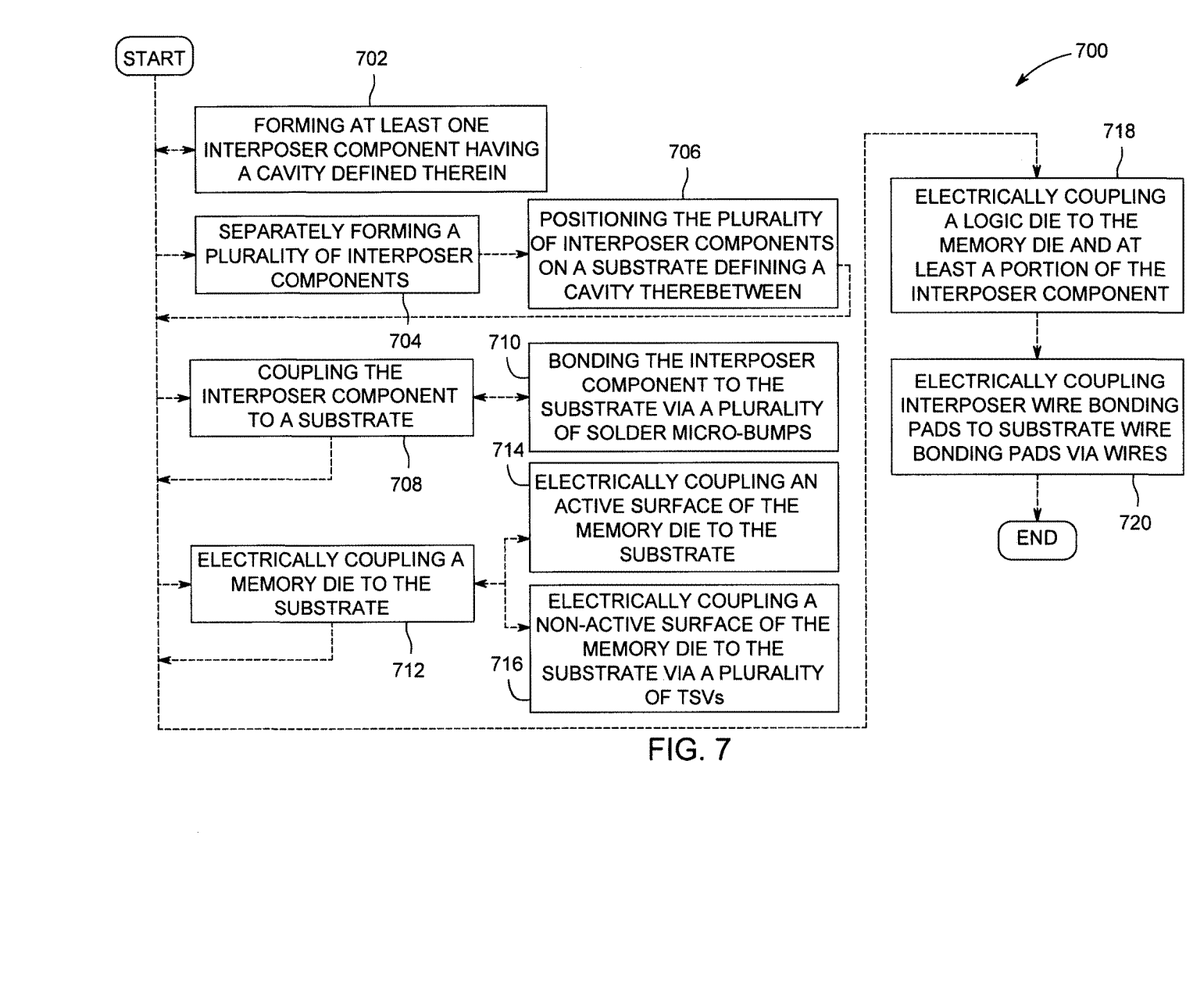
FIG. 7 is a flow diagram of an exemplary method of forming an IC device having a single 3D package structure, such as the exemplary IC device shown in FIG. 3.

FIG. 7 is a flow diagram of an exemplary method 700 of forming an IC device having a single 3D package structure, such as exemplary IC device 300 shown in FIG. 3. With reference to FIGS. 3-6, exemplary method 700 includes forming 702 at least one connection component, for example connection component 304, having a cavity 324 defined therein. Additionally or alternatively, method 700 includes separately forming 704 a plurality of connection components, for example, connection components 502, 504, 506, 508, and/or 602 and 604, and positioning 706 the plurality of connection components 502, 504, 506, 508, and/or 602 and 604 on a substrate, such as substrate 302, to define a cavity (e.g., cavity 524 or 624, respectively) therebetween. Each connection component 304, 502, 504, 506, 508, and/or 602 and 604 includes one or more wire bonding pads (e.g., wire bonding pad 326, 526, or 626, respectively) formed on redistribution wiring layer 334, 534, or 634, respectively. In addition, substrate 302 includes one or more wire bonding pads 330 formed on active surface 331 of substrate 302.

In the exemplary embodiment, method 700 also includes coupling 708 the at least one connection component to substrate 302. Additionally or alternatively, the operation of coupling 708 the at least one connection component further includes bonding 710 the at least one connection component to substrate 302 via adhesive bonding, solder micro-bumps 306, and any other electrical or non-electrical bonding process that enables IC device 300 to function as described herein.

In some embodiments, method 700 includes electrically coupling 712 at least one memory die 312 to substrate 302 via a plurality of solder micro-bumps 322, such that memory die 312 is positioned within the cavity defined by the at least one connection component. In one such embodiment, electrically coupling 712 the at least one memory die 312 to substrate 302 includes electrically coupling 714 active surface 316 of memory die 312 to substrate 302. In an alternative embodiment, the operation of electrically coupling 712 at least one memory die 312 to substrate 302 includes electrically coupling 716 a plurality of TSVs 320 to substrate 302 via a plurality of solder micro-bumps 322, i.e., coupling a non-active surface of memory die 312 to substrate 302.

In the exemplary embodiment, method 700 further includes electrically coupling 718 logic die 308 to memory die 312 and at least a portion of the connection components. For example, logic die 308 is coupled to memory die 312 via a plurality of solder micro-bumps 314. In addition, logic die 308 is coupled to the at least one connection component via a plurality of solder micro-bumps 310. In one embodiment, logic die 308 overlies memory die 312 entirely. In an alternative embodiment, logic die 308 only partially overlies memory die 312.

Moreover, method 700 includes electrically coupling 720 the connection component bonding pads, for example pads 326, 526, or 626, to substrate bonding pads 330 via wires 332. This facilitates electrically coupling logic die 308 to substrate 302.

The above-described embodiments of connection components and methods enable making of IC devices with thermally advantageous arrangements, improved heat dissipation, and reduced complexity and cost of manufacturing as compared to at least some known IC devices. Specifically, the disclosed connection component embodiments include a cavity configured to receive at least one reduced power dissipation component, for example, a memory die (or memory die stack). The cavity facilitates electrically coupling the memory die to a logic die and an IC package substrate, vertically positioning the memory die therebetween. This enables the memory die, which is typically positioned on top of the logic die due to a reduced number of electrical interconnection, to have its logic die connections couple directly to the logic die and the remaining connection to couple to other circuitry on the substrate. In addition, such an arrangement reduces and/or eliminates the need for TSVs to be formed in the logic die, thereby reducing size and complexity of the logic die. The connection component enables the logic die to electrically connect to the circuitry on the substrate via wire bonds (e.g., ball bonding, wedge bonding, and compliant bonding), thereby reducing and/or eliminating the need for TSVs formed in the memory die to pass electric signals from the logic die. Also specifically, the connection component facilitates reducing the complexity, time, and cost of fabricating the IC devices described herein.

An exemplary technical effect of the methods, systems, and apparatus described herein includes at least one of: (a) placing the logic die on the outside of the package structure (versus being sandwiched between a memory die and the substrate), leading to better thermal management and hence enhanced performance; (b) reducing the complexity of the logic die (i.e., reducing or eliminating TSVs) and thereby manufacturing cost; and (c) reducing the overall cost of an IC device further through the use of a wire bonded connection component.

Exemplary embodiments of connection components defining cavities for 3D stacked dies and methods are described above in detail. The connection components having cavities, and the methods using such connection components, are not limited to the specific embodiments described herein, but rather, components of systems and/or operations of the methods may be utilized independently and separately from other components and/or operations described herein. For example, the exemplary embodiments can be implemented and utilized in connection with many other applications that are currently configured to use stacked integrated circuit devices.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) device comprising:
   a substrate;
   a connection component comprising a cavity defined therethrough, said connection component coupled to said substrate;
   at least one memory die positioned in said cavity, said at least one memory die electrically coupled to said substrate; and
   a logic die extending over said at least one memory die and at least a portion of said connection component, said at least one logic die electrically coupled to said connection component and said at least one memory die, wherein said connection component is free of through silicon vias, and wherein said connection component is electrically coupled to said substrate through at least one wire bond.

2. The IC device in accordance with claim 1, wherein said connection component comprises a redistribution wiring layer comprising at least one wire bonding pad and said substrate comprises at least one substrate bonding pad, and said at least one wire bonding pad is electrically coupled to said substrate bonding pad through said at least one wire bond.

3. The IC device in accordance with claim 1, wherein said at least one memory die comprises an active surface, said active surface faces said substrate and faces away from said logic die.

4. The IC device in accordance with claim 1, wherein said at least one memory die comprises an active surface, said active surface faces said logic die and faces away from said substrate.

5. The IC device in accordance with claim 1, wherein said connection component is a passive connection component.

6. The IC device in accordance with claim 5, wherein said passive connection component comprises at least one passive component embedded therein.

7. The IC device in accordance with claim 6, wherein said passive component comprises one or more of the following: resistors, capacitors, and inductors.

8. The IC device in accordance with claim 1, wherein said connection component is an active connection component.

9. The IC device in accordance with claim 8, wherein said active connection component comprises at least one active electrical component embedded therein.

10. The IC device in accordance with claim 9, wherein said active electrical component comprises one or more of the following: transistors, signal amplifiers, and signal filters.

11. An integrated circuit (IC) device comprising:
    a substrate comprising a first active surface, said first active surface comprising a plurality of substrate bonding pads;
    a plurality of connection components coupled to said first active surface, said plurality of connection components arranged to define a cavity between said plurality of connection components, each connection component of said plurality of connection components comprising a second active surface opposite said first active surface, each said second active surface comprising at least one connection component bonding pad;
    at least one memory die positioned within said cavity and electrically coupled to said first active surface; and a logic die coupled to each said second active surface and said at least one memory die, wherein said plurality of connection components are free of through silicon vias, and wherein each said at least one connection component bonding pad is electrically coupled to a substrate bonding pad of said plurality of substrate bonding pads through at least one wire bond.

12. The IC device in accordance with claim 11, wherein at least one connection component of said plurality of connection components is a passive connection component.

13. The IC device in accordance with claim 12, wherein said at least one passive connection component comprises at least one passive component embedded therein.

14. The IC device in accordance with claim 13, wherein said at least one passive component comprises one or more of the following: resistors, capacitors, and inductors.

15. The IC device in accordance with claim 11, wherein at least one connection component of said plurality of connection components is an active connection component.

16. The IC device in accordance with claim 15, wherein said active connection component comprises at least one active electrical component embedded therein.

17. The IC device in accordance with claim 16, wherein said active electrical component comprises one or more of the following: transistors, signal amplifiers, and signal filters.

18. A method of forming an IC device having a 3D package structure, said method comprising:
 forming a connection component free of through silicon vias, the connection component including a cavity defined therethrough and a redistribution wiring layer including a connection component bonding pad;
 coupling the connection component to a substrate, the substrate including a substrate bonding pad;
 coupling at least one memory die to the substrate such that memory die is positioned within the cavity;
 extending a logic die over the memory die and at least a portion of the connection component;
 electrically coupling the logic die to the memory die and the at least a portion of the connection component; and
 electrically coupling the connection component bonding pad to the substrate bonding pad through at least one wire bond.

19. The method in accordance with claim 18, wherein forming the connection component comprises separately forming a plurality of connection components, each connection component of the plurality of connection components including a connection component bonding pad, and wherein coupling the connection component to a substrate comprises:
 positioning the plurality of connection components on the substrate to define a cavity between the plurality of connection components; and
 coupling the plurality of connection components to the substrate.

20. The method in accordance with claim 18, wherein coupling the at least one memory die to the substrate comprises:
 electrically coupling a first surface of the memory die to the substrate; and
 electrically coupling a second surface of the memory die to the substrate through a plurality of through silicon vias formed in the memory die, the second surface opposite the first surface.

\* \* \* \* \*